United States Patent
Fernandes Barros et al.

(10) Patent No.: US 9,094,079 B2
(45) Date of Patent: Jul. 28, 2015

(54) SYSTEM AND METHOD FOR I-Q IMBALANCE CORRECTION

(71) Applicant: QUALCOMM Incorporated, San Diego, CA (US)

(72) Inventors: Daniel Jose Fernandes Barros, Redwood City, CA (US); Le Nguyen Luong, San Diego, CA (US); James Young Hurt, San Diego, CA (US); Yann Ly-Gagnon, San Jose, CA (US); Paul James Husted, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 13/647,332

(22) Filed: Oct. 8, 2012

(65) Prior Publication Data

US 2014/0098913 A1    Apr. 10, 2014

(51) Int. Cl.

| | |
|---|---|
| *H04B 1/06* | (2006.01) |
| *H04B 1/10* | (2006.01) |
| *G01S 19/23* | (2010.01) |
| *H03D 3/00* | (2006.01) |
| *H04L 27/38* | (2006.01) |

(Continued)

(52) U.S. Cl.
CPC ............ *H04B 1/1036* (2013.01); *G01S 19/235* (2013.01); *H03D 3/009* (2013.01); *H04B 1/1027* (2013.01); *H04L 27/3809* (2013.01); *H04L 27/3863* (2013.01); *H03J 7/04* (2013.01); *H04L 27/2647* (2013.01); *H04L 2027/003* (2013.01)

(58) Field of Classification Search
CPC . H04B 1/1027; H03F 1/3247; H04L 27/2647; H04L 27/2273; H04L 27/2332

USPC ............ 375/322, 346, 350, 371; 455/67.11, 455/230, 296, 324
See application file for complete search history.

(56) References Cited

U.S. PATENT DOCUMENTS

| | | |
|---|---|---|
| 7,643,600 B2 | 1/2010 | Maxim et al. |
| 7,925,217 B2 | 4/2011 | Park et al. |

(Continued)

FOREIGN PATENT DOCUMENTS

EP    0180339 A2    5/1986

OTHER PUBLICATIONS

International Search Report—PCT/US2013/063630—ISA/EPO—Apr. 1, 2014.

*Primary Examiner* — Leon-Viet Nguyen
(74) *Attorney, Agent, or Firm* — Bay Area Technology Law Group PC

(57) ABSTRACT

Systems and methods are disclosed for compensating I-Q imbalance in a wireless receiver. The receiver may employ a quadrature downconverter configured to receive an RF signal input and output an in-phase component and a quadrature component at an IF, an IF rotation block configured to downconvert the in-phase and quadrature components to baseband and an I-Q correction block configured to compensate for an I-Q imbalance in the received signal, wherein the I-Q correction block is positioned downstream from the IF rotation block in the signal path. Performing the I-Q correction after conversion to baseband may allow the compensation calculations to operate at a reduced digital rate. Similarly, digitally adjusting the gain of the signal prior to I-Q compensation may reduce the number of bits that are manipulated during the compensation process. These features may represent significant efficiencies as compared to I-Q corrections performed at IF.

18 Claims, 5 Drawing Sheets

(51) Int. Cl.
*H03J 7/04* (2006.01)
*H04L 27/26* (2006.01)
*H04L 27/00* (2006.01)

(56) References Cited

U.S. PATENT DOCUMENTS

| | | |
|---|---|---|
| 7,962,113 B2 | 6/2011 | Gao et al. |
| 8,112,050 B2 | 2/2012 | Balakrishnan |
| 8,135,055 B2 * | 3/2012 | Kohlmann .................... 375/224 |
| 2006/0250941 A1 * | 11/2006 | Onggosanusi et al. ........ 370/208 |
| 2008/0014895 A1 | 1/2008 | Li et al. |
| 2010/0135437 A1 * | 6/2010 | Lee et al. ...................... 375/324 |
| 2010/0278285 A1 * | 11/2010 | Lin ................................ 375/327 |
| 2012/0220246 A1 * | 8/2012 | Kushnir et al. ............... 455/118 |
| 2013/0266045 A1 * | 10/2013 | Lakkis .......................... 375/219 |

* cited by examiner

US 9,094,079 B2

SYSTEM AND METHOD FOR I-Q IMBALANCE CORRECTION

FIELD OF THE PRESENT INVENTION

This disclosure generally relates to digital intermediate frequency receivers and more particularly to techniques for correcting I-Q imbalance to provide enhanced image rejection.

BACKGROUND OF THE INVENTION

Radio frequency (RF) communication systems generally rely on the upconversion of a data signal to a suitable carrier frequency for transmission and then downconversion at the receiver. One popular architecture for wireless receivers is a superheterodyne design in which the frequency downconversion takes place in at least two stages. The received signal may first be downconverted from the carrier frequency to an intermediate frequency (IF). Downconversion to IF from the carrier frequency facilitates filtering and amplifying the signal by the front end of the receiver. Subsequently, the IF signal may then be downconverted to baseband to allow recovery of the data signal.

While IF receivers exhibit a number of desirable attributes, they typically require an image rejection strategy to compensate for the generation of the image frequency that results from the downconversion to IF. Receivers employing a quadrature architecture provide image rejection through the use of two distinct channels to form the in-phase (I) and the quadrature-phase (Q) components of the received signal. Through appropriate filtering and mixing of the I and Q components, image rejection of interfering jammers may be achieved. A quadrature generator mixes the sine and cosine components of the carrier signal to extract the I and Q components. As will be appreciated, if the two signal components have a phase relationship of 90° with respect to one another, the interfering image may be perfectly rejected.

In practice, the quadrature generator uses the signal output by a local oscillator that does not perform in an ideal manner. As a result, the generated I and Q signal components may have phases that are not exactly 90° with respect to each other or the signal components may experience different gains. Therefore, as used herein, the term I-Q imbalance includes phase mismatch, unequal gain, or both. Notably, any I-Q imbalance may result in imperfect cancellation of the interfering image. Consequently, many strategies have been implemented to correct for I-Q imbalance to improve image rejection.

Conventional approaches may involve applying a correction at IF to compensate for the I-Q imbalance. For example, FIG. 1 depicts a simplified block diagram of a prior art digital receiver 100. As shown, an RF signal is received at antenna 102 and fed through low noise amplifier (LNA) 104 to quadrature downconverter 106, which mixes cosine and sine signals at the carrier frequency from local oscillator 108 to generate the in-phase (I) and quadrature (Q) signal components. Each channel includes lowpass filters 110 and 112 and analog to digital converters (ADCs) 114 and 116, respectively, and provides the digitized components to digital signal processor (DSP) 120. Within DSP 120, the I and Q signal components are combined by adder 122, fed through filters 124 and input to I-Q correction block 126. The corrected signal is downconverted to baseband by IF rotation block 128 by mixing with output from a local oscillator (LO) 130, fed through filters 132, and gain adjusted by digital variable gain amplifier (DVGA) 134. Decimator 136 then reduces the sample rate of the signal and outputs to demodulator 138 to recover the data stream.

As will be appreciated, the I-Q correction provided by receiver 100 involves performing the calculations necessary to compensate for any I-Q imbalance to the signal at IF. Consequently, receiver 100 performs the correction at the digital sample rate of the IF signal and prior to gain adjustment by DVGA 134. Performing the I-Q imbalance correction in this manner may require considerable computational resources and power expenditure. Accordingly, the techniques of this disclosure are directed to providing I-Q imbalance correction with reduced power consumption and computational overhead.

SUMMARY OF THE INVENTION

In accordance with the above needs and those that will be mentioned and will become apparent below, this specification discloses a digital wireless receiver for receiving a data signal, wherein the receiver has a signal path including a quadrature downconverter configured to receive a radio frequency (RF) signal corresponding to the data signal and output an in-phase component and a quadrature component at an intermediate frequency (IF), an IF rotation block configured to downconvert the in-phase component and quadrature component to baseband and an I-Q correction block configured to compensate for an I-Q imbalance in the received signal, wherein the I-Q correction block is positioned downstream from the IF rotation block in the signal path.

In one aspect, the receiver further may include a digital variable gain element positioned upstream from the I-Q correction block in the signal path. In another aspect, the receiver may include analog to digital converters operating at a sample rate to digitize the in-phase component and the quadrature component produced by the quadrature downconverter and a decimator configured to provide an internal rate lower than the sample rate, wherein the I-Q correction block is positioned downstream from the decimator in the signal path. In yet another aspect, the receiver includes both the digital variable gain element and the decimator. Accordingly, the I-Q correction block may operate at the internal rate.

Further, upconversion of the data signal to IF prior to transmission may be modeled by a matrix A such that IF rotation block may be configured to perform an operation corresponding to multiplication by an inverse of matrix A, matrix $A^{-1}$. In addition, the I-Q imbalance may be modeled as a matrix B such that the I-Q correction block may be configured to perform a matrix multiplication by $A^{-1}B^{-1}A$.

In such embodiments, $A^{-1}B^{-1}A$ may equal $$\begin{bmatrix} c_{11} & c_{12} \\ c_{21} & c_{22} \end{bmatrix},$$

where $$c_{11} = \cos^2(2\pi f_{IF} n T_{in}) - \tan(\theta)\sin(2\pi f_{IF} n T_{in})\cos(2\pi f_{IF} n T_{in}) + \frac{\sin^2(2\pi f_{IF} n T_{in})}{\alpha\cos(\theta)}$$

$$c_{12} = -\sin(2\pi f_{IF} n T_{in})\cos(2\pi f_{IF} n T_{in}) + \tan(\theta)\sin^2(2\pi f_{IF} n T_{in}) + \frac{\sin(2\pi f_{IF} n T_{in})\cos(2\pi f_{IF} n T_{in})}{\alpha\cos(\theta)}$$

-continued $$c_{21} = -\sin(2\pi f_{IF}nT_{in})\cos(2\pi f_{IF}nT_{in}) - \tan(\theta)\cos^2(2\pi f_{IF}nT_{in}) + \frac{\sin(2\pi f_{IF}nT_{in})\cos(2\pi f_{IF}nT_{in})}{\alpha\cos(\theta)}$$

$$c_{22} = \sin^2(2\pi f_{IF}nT_{in}) + \tan(\theta)\sin(2\pi f_{IF}nT_{in})\cos(2\pi f_{IF}nT_{in}) + \frac{\cos^2(2\pi f_{IF}nT_{in})}{\alpha\cos(\theta)}$$

$T_{in}$ is an internal digital rate of the receiver and $f_{IF}$ is the IF.

The receiver may also include a look up table holding values for $c_{11}$, $c_{12}$, $c_{21}$ and $c_{22}$. As desired, the values for the look up table may be determined during calibration.

This disclosure is also directed to a method for providing I-Q imbalance compensation for a received data signal including the steps of mixing a received RF signal corresponding to the data signal with a cosine output of a local oscillator to extract an in-phase component at IF and a sine output of the local oscillator to extract a quadrature component at IF, applying an IF rotation to the in-phase component and the quadrature component to downconvert the in-phase component and the quadrature component to baseband, and applying an I-Q imbalance compensation to the in-phase component and the quadrature component at baseband.

Notably, the method may include digitally adjusting the gain of the in-phase component and the quadrature component prior to applying the I-Q imbalance compensation. Further, the method may include downsampling the sample rate of the in-phase component and the quadrature component at IF to an internal rate lower than the sample rate prior to applying the I-Q imbalance compensation. As desired, both steps may be employed. In addition, the I-Q imbalance compensation may be applied at the internal rate.

In one aspect, upconversion of the data signal to IF prior to transmission is modeled by a matrix A such that applying the IF rotation to the in-phase component and the quadrature component corresponds to multiplication by an inverse of matrix A, matrix $A^{-1}$. Further, the I-Q imbalance may be modeled as a matrix B such that applying the I-Q imbalance compensation to the in-phase component and the quadrature component at baseband corresponds to matrix multiplication by $A^{-1}B^{-1}A$.

In one embodiment, $$A^{-1}B^{-1}A = \begin{bmatrix} c_{11} & c_{12} \\ c_{21} & c_{22} \end{bmatrix},$$

where $$c_{11} = \cos^2(2\pi f_{IF}nT_{in}) - \tan(\theta)\sin(2\pi f_{IF}nT_{in})\cos(2\pi f_{IF}nT_{in}) + \frac{\sin^2(2\pi f_{IF}nT_{in})}{\alpha\cos(\theta)}$$

$$c_{12} = -\sin(2\pi f_{IF}nT_{in})\cos(2\pi f_{IF}nT_{in}) + \tan(\theta)\sin^2(2\pi f_{IF}nT_{in}) + \frac{\sin(2\pi f_{IF}nT_{in})\cos(2\pi f_{IF}nT_{in})}{\alpha\cos(\theta)}$$

$$c_{21} = -\sin(2\pi f_{IF}nT_{in})\cos(2\pi f_{IF}nT_{in}) - \tan(\theta)\cos^2(2\pi f_{IF}nT_{in}) + \frac{\sin(2\pi f_{IF}nT_{in})\cos(2\pi f_{IF}nT_{in})}{\alpha\cos(\theta)}$$

$$c_{22} = \sin^2(2\pi f_{IF}nT_{in}) + \tan(\theta)\sin(2\pi f_{IF}nT_{in})\cos(2\pi f_{IF}nT_{in}) + \frac{\cos^2(2\pi f_{IF}nT_{in})}{\alpha\cos(\theta)}$$

$T_{in}$ is an internal digital rate of the receiver and $f_{IF}$ is the IF.

In a further aspect, the method may include storing values for $c_{11}$, $c_{12}$, $c_{21}$ and $c_{22}$ in a look up table. The method may also include determining the values for the look up table during calibration.

BRIEF DESCRIPTION OF THE DRAWINGS

Further features and advantages will become apparent from the following and more particular description of the preferred embodiments of the invention, as illustrated in the accompanying drawings, and in which like referenced characters generally refer to the same parts or elements throughout the views, and in which.

DETAILED DESCRIPTION OF THE INVENTION

Figure 1:
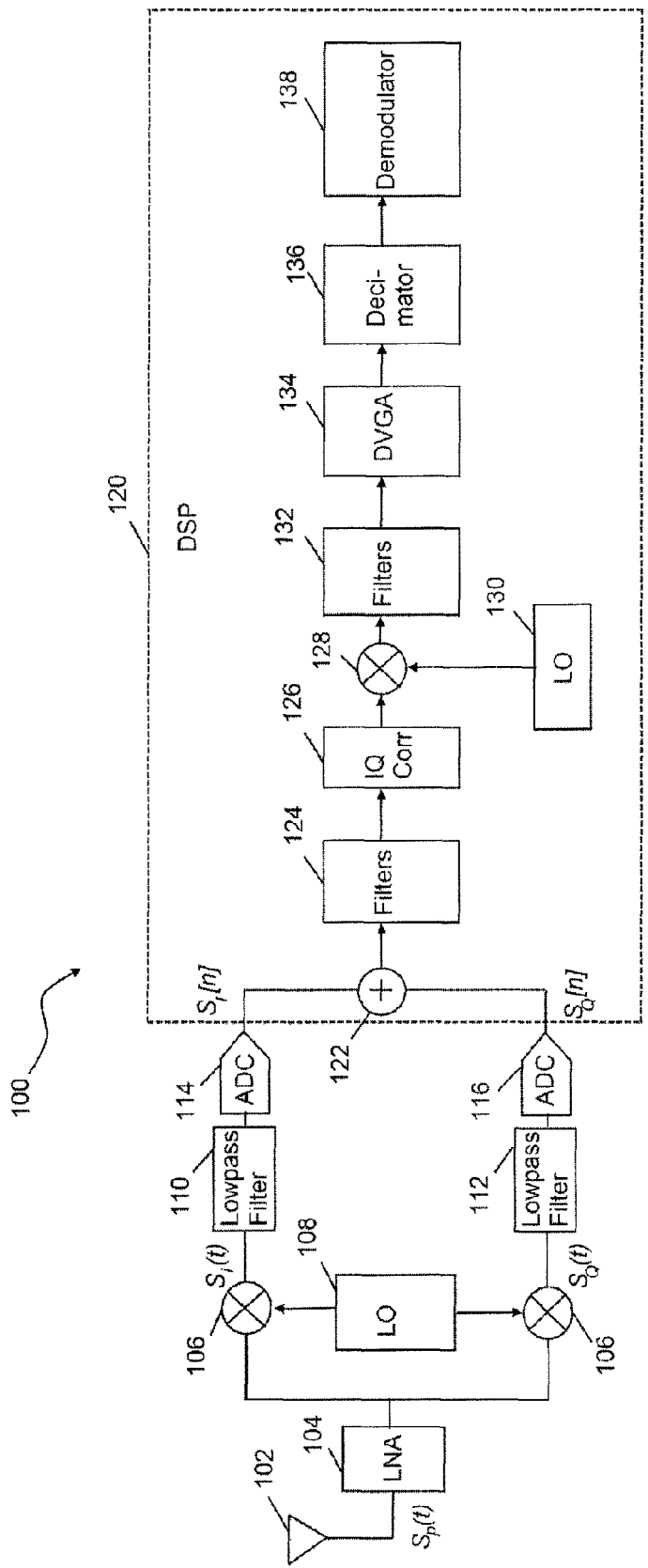
FIG. 1 depicts a prior art receiver architecture for providing I-Q imbalance compensation.

At the outset, it is to be understood that this disclosure is not limited to particularly exemplified materials, architectures, routines, methods or structures as such may, of course, vary. Thus, although a number of such options, similar or equivalent to those described herein, can be used in the practice or embodiments of this disclosure, the preferred materials and methods are described herein.

It is also to be understood that the terminology used herein is for the purpose of describing particular embodiments of this disclosure only and is not intended to be limiting.

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the specification. It will be apparent to those skilled in the art that the exemplary embodiments of the specification may be practiced without these specific details. In some instances, well known structures and devices are shown in block diagram form in order to avoid obscuring the novelty of the exemplary embodiments presented herein.

For purposes of convenience and clarity only, directional terms, such as top, bottom, left, right, up, down, over, above, below, beneath, rear, back, and front, may be used with respect to the accompanying drawings or chip embodiments. These and similar directional terms should not be construed to limit the scope of the invention in any manner.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

"Complementary logic," which refers to logic circuitry involving both P-channel and N-channel transistors, is often more commonly referred to as CMOS (Complementary Metal Oxide Semiconductor) logic even though the transistors making up the logic circuitry may not have metal gates and may not have oxide gate dielectrics.

The terms second level and first level, high and low and 1 and 0, as used in the following description may be used to describe various logic states as known in the art. Particular voltage values of the second and first levels are defined arbitrarily with regard to individual circuits. Furthermore, the voltage values of the second and first levels may be defined differently for individual signals such as a clock and a digital data signal. Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" or low and high in certain locations, one skilled in the art appreciates that the logical values can be switched, with the remainder of the circuit adjusted accordingly, without affecting operation of the present invention.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

Unless defined otherwise, all technical and scientific terms used herein have the same meaning as commonly understood by one having ordinary skill in the art to which the disclosure pertains.

Further, all publications, patents and patent applications cited herein, whether supra or infra, are hereby incorporated by reference in their entirety.

Finally, as used in this specification and the appended claims, the singular forms "a," "an" and "the" include plural referents unless the content clearly dictates otherwise.

As will be discussed in detail below, this disclosure is directed to a receiver for use in a wireless communication system, wherein the receiver has a signal path comprising a quadrature downconverter configured to receive an RF signal input and output, an in-phase component and a quadrature component at an IF, an IF rotation block configured to downconvert the in-phase and quadrature components to baseband and an I-Q correction block configured to compensate for an I-Q imbalance in the received signal, wherein the I-Q correction block is positioned downstream from the IF rotation block in the signal path. These techniques may be applied to any suitable digital heterodyne-based receiver, including those used in wireless communications systems such as BLUETOOTH® (Bluetooth), wireless local area networks (WLANs) based on IEEE 802.11 protocols, and the like.

As discussed above, inaccuracies in the local oscillator of a receiver may introduce an I-Q imbalance in the modulated signal at the IF. A matrix model may be used to estimate the I-Q imbalance and to subsequently compensate for the imbalance through the use of a suitably configured I-Q correction block. A real data passband signal with an IF may be expressed as Equation (1):

$$s_p(t) = \sqrt{2} x_1(t) \cos 2\pi(f_c+f_{IF})t - \sqrt{2} x_Q(t) \sin 2\pi(f_c+f_{IF})t, \quad (1)$$

where $x_1(t)$ and $x_Q(t)$ are the I and Q components of the data signal, respectively, $f_c$ is the carrier frequency and $f_{IF}$ is the IF. Further, the real passband signal may also be represented using complex baseband analysis as Equation (2):

$$s_p(t) = \Re\, e\{\sqrt{2} w_{bb}(t) e^{j2\pi f_c t}\}, \quad (2)$$

where $w_{bb}(t)$ is the equivalent complex baseband signal of the signal $s_p(t)$ and is given by Equation (3):

$$\begin{aligned}
w_{bb}(t) &= s_{bb}(t) e^{j2\pi f_{IF} t} \\
&= (x_I(t) + j x_Q(t)) e^{j2\pi f_{IF} t} \\
&= (x_I(t)\cos(2\pi f_{IF} t) - x_Q(t)\sin(2\pi f_{IF} t)) + \\
&\quad j(x_I(t)\sin(2\pi f_{IF} t) + x_Q(t)\cos(2\pi f_{IF} t))
\end{aligned} \quad (3)$$

where $w_{bb}(t) = x_1(t) + j x_Q(t)$ is the data-bearing signal. From Equations (2) and (3), $w_{bb}(t)$ for the IF receiver may be expressed in the form of a matrix product as indicated in Equation (6):

$$\begin{bmatrix} \cos(2\pi f_{IF} t) & -\sin(2\pi f_{IF} t) \\ \sin(2\pi f_{IF} t) & \cos(2\pi f_{IF} t) \end{bmatrix} \begin{bmatrix} x_I(t) \\ x_Q(t) \end{bmatrix} = \begin{bmatrix} \Re e\{w_{bb}(t)\} \\ \Im m\{w_{bb}(t)\} \end{bmatrix} \quad (4)$$

Figure 2:
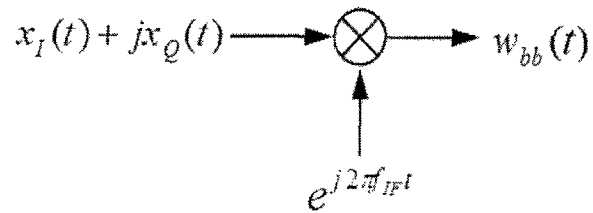
FIG. 2 schematically depicts upconversion of a data-bearing signal to IF, that may be used with an embodiment of the invention.

One of skill in the art will appreciate that Equation (6) corresponds to the upconversion to IF of the data-bearing signal as shown schematically in FIG. 2. Accordingly, for the purposes of this disclosure, matrix A may be defined as $$\begin{bmatrix} \cos(2\pi f_{IF} t) & -\sin(2\pi f_{IF} t) \\ \sin(2\pi f_{IF} t) & \cos(2\pi f_{IF} t) \end{bmatrix}$$

and represents the upconversion of the data-bearing signal.

As described above, the passband signal at the receiver is downconverted to IF and the I and Q components extracted by a quadrature downconverter that mixes the cosine and sine components of a signal generated by a local oscillator. Due to performance of the local oscillator, the I and Q signals may not have the 90° phase relationship with each other and may have unequal gain, leading to phase mismatch and gain imbalance between the two components. By establishing the I signal component as the reference, the gain imbalance α and phase mismatch θ may be expressed with regard to the Q signal component as indicated by Equation (7):

$$s_I(t) = x_I(t)$$

$$s_Q(t) = \alpha \sin(\theta) x_I(t) + \alpha \cos(\theta) x_Q(t) \quad (7)$$

Accordingly, when there is no I-Q imbalance such that α=1 and θ=0, $s_Q(t)=x_Q(t)$ indicates the receiver correctly detects the desired components.

Figure 3:
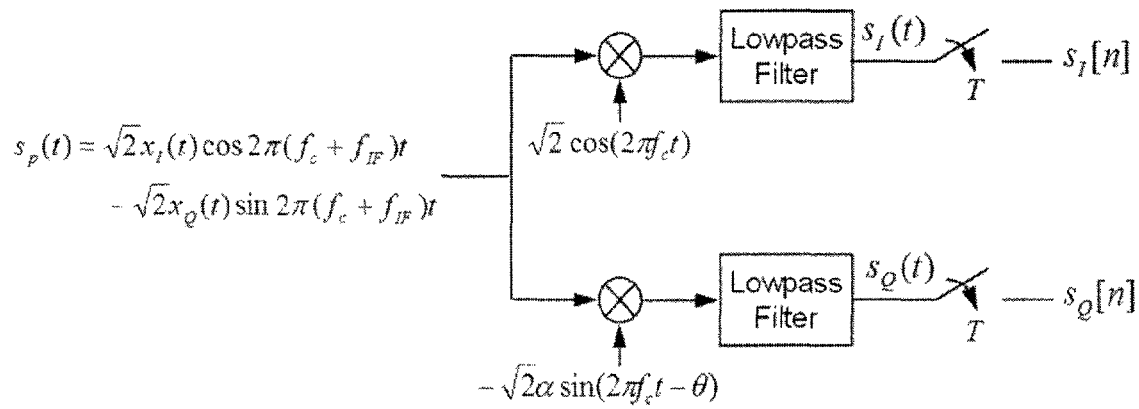
FIG. 3 schematically depicts quadrature downconversion of a data-bearing signal to in-phase and quadrature components subject to I-Q imbalances, that may be used with an embodiment of the invention.

FIG. 3 schematically depicts the quadrature downconversion of the passband data-bearing signal using a local oscillator having gain imbalance and phase mismatch in the analog front end of receiver. As shown, the I and Q signal components are filtered and digitized to provide the IF signal components, $s_I[n]$ and $s_Q[n]$. In view of the complex baseband signal $w_{bb}(t)$ defined in Equation (3), the I-Q imbalance may also be modeled as a matrix product, as indicated by Equation (8):

$$\begin{bmatrix} s_I(t) \\ s_Q(t) \end{bmatrix} = \begin{bmatrix} 1 & 0 \\ \alpha\sin(\theta) & \alpha\cos(\theta) \end{bmatrix} \begin{bmatrix} \mathrm{Re}\{w_{bb}(t)\} \\ \mathrm{Im}\{w_{bb}(t)\} \end{bmatrix} \quad (8)$$

In turn, for the purposes of this disclosure, matrix B may be defined as $$\begin{bmatrix} 1 & 0 \\ \alpha\sin(\theta) & \alpha\cos(\theta) \end{bmatrix}$$

and represents the effect of I-Q imbalance on the data-bearing signal.

Figure 4:
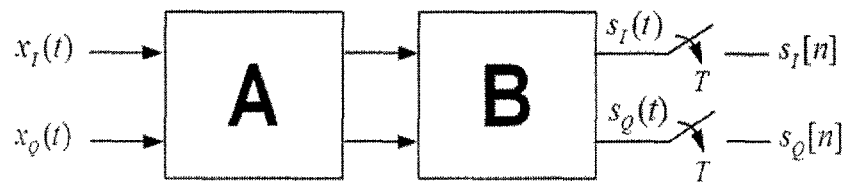
FIG. 4 schematically depicts a matrix model of a data-bearing signal output by the front end of a receiver, that may be used with an embodiment of the invention.
Figure 5:
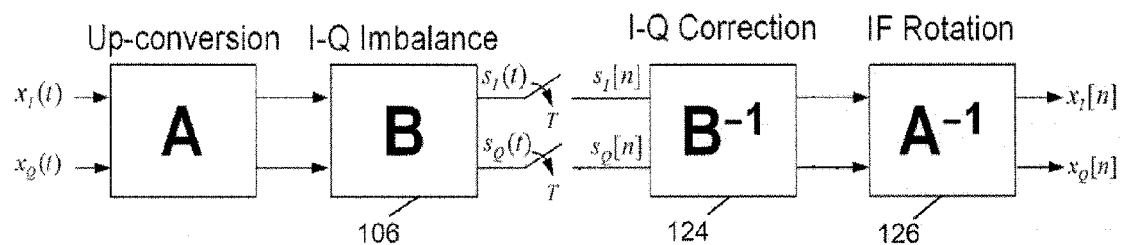
FIG. 5 schematically depicts a matrix model for conventional I-Q imbalance compensation.

The above discussion establishes that the signal produced by the front end of a quadrature receiver may be modeled as a product resulting from multiplication of the signal by the two matrices, A and B, as shown in FIG. 4. Returning to the example of conventional receiver 100 depicted in FIG. 1, a strategy for correcting the I-Q imbalance may involve performing matrix inversions using the matrices $B^{-1}$ and $A^{-1}$ on the front end output of receiver 100, as schematically represented in FIG. 5, wherein $$B^{-1} = \frac{1}{\alpha\cos(\theta)} \begin{bmatrix} \alpha\cos(\theta) & 0 \\ -\alpha\sin(\theta) & 1 \end{bmatrix} = \begin{bmatrix} 1 & 0 \\ -\tan(\theta) & 1/[\alpha\cos(\theta)] \end{bmatrix} \text{ and}$$

$$A^{-1} = \begin{bmatrix} \cos(2\pi f_{IF} nT) & \sin(2\pi f_{IF} nT) \\ -\sin(2\pi f_{IF} nT) & \cos(2\pi f_{IF} nT) \end{bmatrix}.$$

Figure 6:
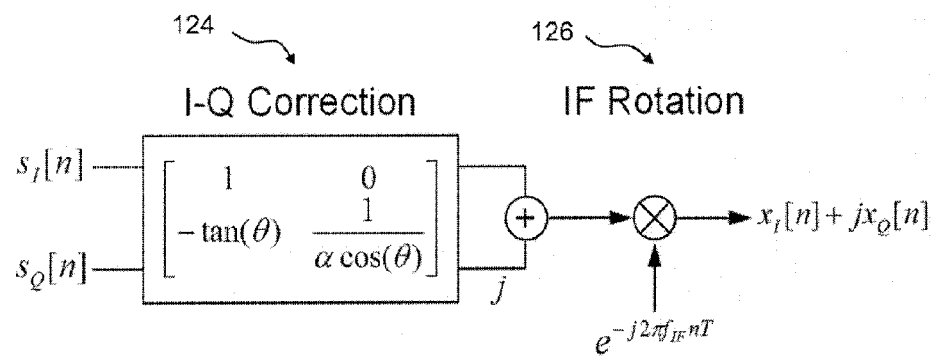
FIG. 6 schematically depicts the equalization architecture for conventional I-Q imbalance compensation.

The sampling frequency of ADCs 114 and 116 is given by $f_s$ and correspondingly, T is the sampling period $1/f_s$. Since matrix $A^{-1}$ represents the downconversion by $-f_{IF}$ performed by IF rotation block 128, the conventional equalization architecture of receiver 100 may be depicted schematically as shown in FIG. 6.

In particular, I-Q correction block 126 may be configured to perform a correction corresponding to multiplying the digitized I and Q signal by the inverse matrix $B^{-1}$ to compensate for the I-Q imbalance imparted by a quadrature downconverter. Following I-Q correction block 126 in the signal path of receiver 100, IF rotation block 128 downconverts the IF signal to baseband. This corresponds to multiplying the signal with the inverse matrix $A^{-1}$. The success of this strategy depends upon applying the compensation for I-Q imbalance using I-Q correction block 126 prior to IF rotation block 128 to preserve the order of operation such that the signal is multiplied by matrix $B^{-1}$ prior to being multiplied by matrix $A^{-1}$.

In contrast, the techniques of this disclosure are directed to applying compensation for I-Q imbalance after the signal has been converted to baseband. By positioning the I-Q correction block downstream from the IF rotation block, a number of efficiencies may be realized. In one aspect, a digital receiver may employ different data rates in different portions of the circuitry. For example, the processing of the IF signal may take place at a higher digital rate than processing of the baseband signal. Correspondingly, positioning the I-Q correction block after the IF rotation allows the computations associated with compensating the I-Q imbalance to be performed at a lower digital rate. This reduced rate allows for reductions in circuitry area, cost and power consumption. In another aspect, positioning the I-Q correction block downstream from the IF rotation block also allows the compensation to be performed after operation of the DVGA. The role of the DVGA is to digitally scale the incoming signal such that it fits within an optimal bit width, so the signal output from the DVGA may represent only the bits necessary for proper demodulation. Accordingly, compensating the I-Q imbalance after digital gain adjustment by the DVGA may reduce the complexity of the associated calculations, also saving area, cost and power.

The matrices A and B used to model upconversion and I-Q imbalance do not exhibit the commutative property, so proper compensation may not be achieved by performing matrix multiplication with matrix $B^{-1}$ subsequent to multiplication with matrix $A^{-1}$. Rather, it may be seen that to provide proper correction, a new matrix C may be defined, such that $C=A^{-1}B^{-1}A$. By substituting the values for the matrices as given above, matrix C may be represented by Equation (9):

$$C = \begin{bmatrix} \cos(2\pi f_{IF} nT_{in}) & \sin(2\pi f_{IF} nT_{in}) \\ -\sin(2\pi f_{IF} nT_{in}) & \cos(2\pi f_{IF} nT_{in}) \end{bmatrix} \begin{bmatrix} 1 & 0 \\ -\tan(\theta) & 1/[\alpha\cos(\theta)] \end{bmatrix} \quad (5)$$

$$\begin{bmatrix} \cos(2\pi f_{IF} nT_{in}) & -\sin(2\pi f_{IF} nT_{in}) \\ \sin(2\pi f_{IF} nT_{in}) & \cos(2\pi f_{IF} nT_{in}) \end{bmatrix}$$

Performing the indicated multiplication results in matrix $$C = \begin{bmatrix} c_{11} & c_{12} \\ c_{21} & c_{22} \end{bmatrix},$$

where $$c_{11} = \cos^2(2\pi f_{IF} nT_{in}) - \tan(\theta)\sin(2\pi f_{IF} nT_{in})\cos(2\pi f_{IF} nT_{in}) + \frac{\sin^2(2\pi f_{IF} nT_{in})}{\alpha\cos(\theta)}$$

$$c_{12} = -\sin(2\pi f_{IF} nT_{in})\cos(2\pi f_{IF} nT_{in}) + \tan(\theta)\sin^2(2\pi f_{IF} nT_{in}) + \frac{\sin(2\pi f_{IF} nT_{in})\cos(2\pi f_{IF} nT_{in})}{\alpha\cos(\theta)}$$

$$c_{21} = -\sin(2\pi f_{IF} nT_{in})\cos(2\pi f_{IF} nT_{in}) - \tan(\theta)\cos^2(2\pi f_{IF} nT_{in}) + \frac{\sin(2\pi f_{IF} nT_{in})\cos(2\pi f_{IF} nT_{in})}{\alpha\cos(\theta)}$$

$$c_{22} = \sin^2(2\pi f_{IF} nT_{in}) + \tan(\theta)\sin(2\pi f_{IF} nT_{in})\cos(2\pi f_{IF} nT_{in}) + \frac{\cos^2(2\pi f_{IF} nT_{in})}{\alpha\cos(\theta)}$$

Figure 7:
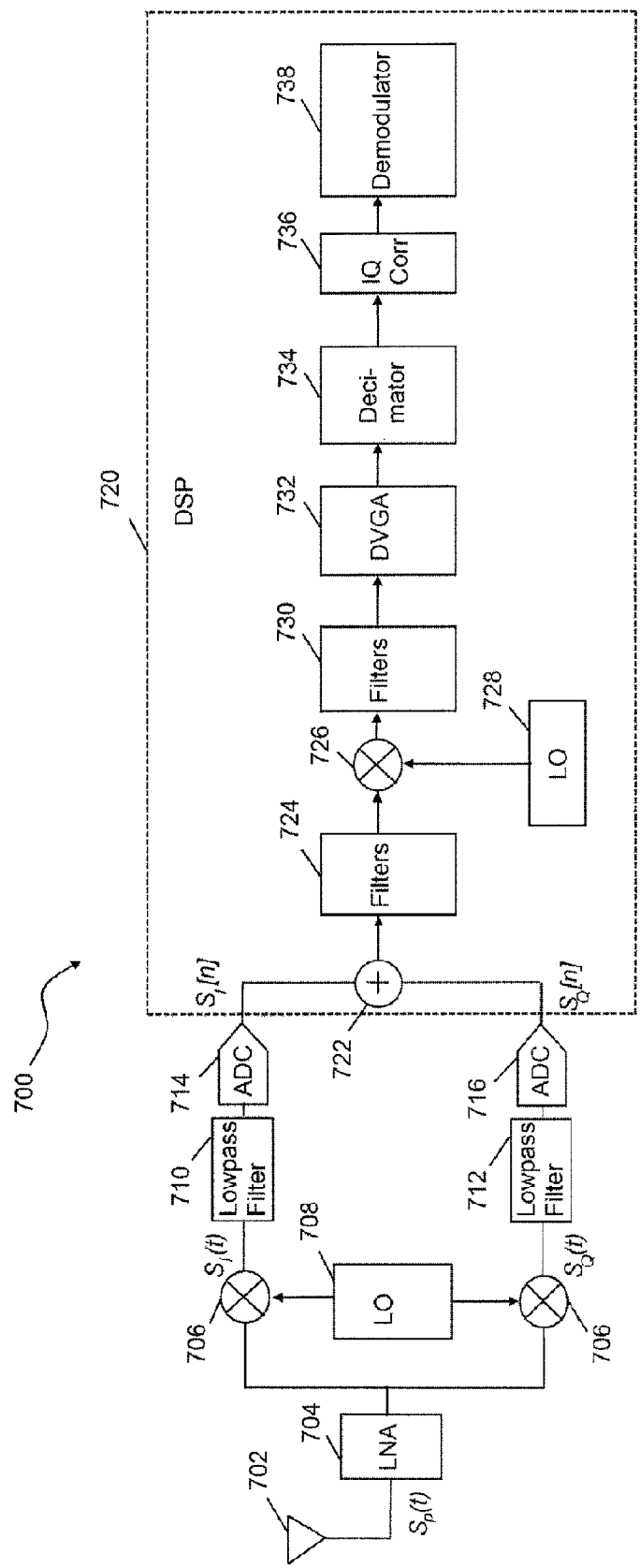
FIG. 7 depicts an exemplary receiver architecture for providing I-Q imbalance compensation, according to an embodiment of the invention.
Figure 8:
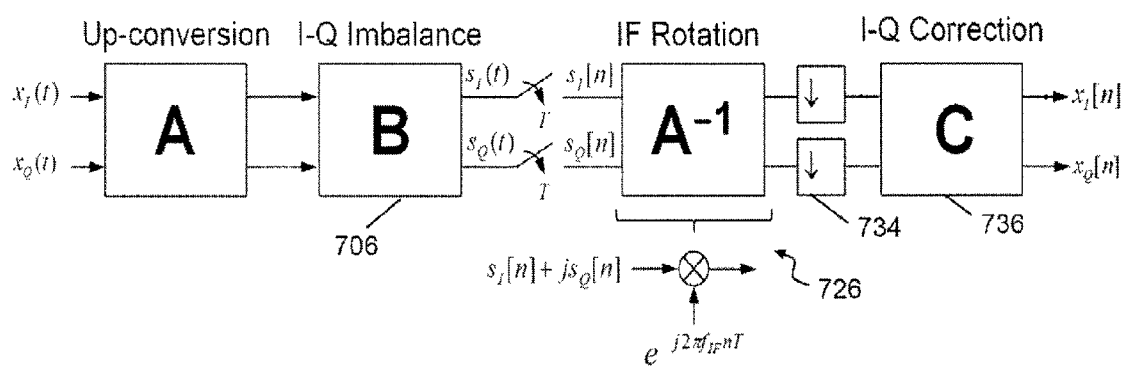
FIG. 8 schematically depicts a matrix model for I-Q imbalance compensation, according to an embodiment of the invention.

An example architecture for performing I-Q imbalance correction using matrix C is depicted in FIG. 7 with regard to digital receiver 700. As shown, antenna 702 receives the RF signal which is then fed through low noise amplifier (LNA) 704 to quadrature downconverter 706, which mixes cosine and sine signals at the carrier frequency from local oscillator (LO) 708 to generate the in-phase (I) and quadrature (Q) signal components. Each channel includes lowpass filters 710 and 712 and analog to digital converters (ADCs) 714 and 716, respectively, and provides the digitized components to digital signal processor (DSP) 720. Within DSP 720, the I and Q signal components are combined by adder 722, fed through filters 724 and downconverted to baseband by IF rotation block 726 by mixing with output from LO 728. The baseband signal is then fed through filters 730 and gain adjusted by DVGA 732. I-Q correction block 736 receives the output from decimator 734 and performs an I-Q imbalance compensation corresponding to the multiplication of the signal by matrix C. The corrected signal is the sent to demodulator 738 to recover the data stream. The functional architecture of receiver 700 is schematically depicted in FIG. 8. As shown, IF rotation block 726 downconverts the signal to baseband, effectively applying multiplication by matrix $A^{-1}$. After the reduction in digital rate by sampler 734, I-Q correction block 736 performs compensation corresponding to multiplication by matrix C.

As described above, baseband portions of DSP 720 may operate at a different digital rate than IF portions, such that decimator 734 may be configured to reduce the sample rate of the signal by a desired factor. For example, the sample rate $f_s$ of ADCs 714 and 716 may be 32 MHz. By applying a downsampling factor of 4, decimator 734 may output the signal at an internal rate $f_{in}$ of 8 MHz. Accordingly, I-Q correction block 736 may similarly operate at 8 MHz, representing substantial power and circuitry savings with respect to prior art implementations that must be applied to the IF signal and correspondingly operate at the sample rate. In general, the downsampling factor may be selected as desired while preferably maintaining the Nyquist sampling requirement. Further, since DVGA 732 reduces any unnecessary bits from the signal stream, the computational demand placed on I-Q correction block 736 is reduced, representing additional efficiencies.

I-Q correction block 736 may be configured to perform the multiplication by matrix C in any suitable manner. In particular, a look up table (LUT) may be provided to store the possible values for gain ($\alpha$) and phase ($\theta$) mismatch. Further, an additional LUT may be employed to store the values for the cosine and sine functions since the matrix C is a time-variant matrix. Computation of the matrix C matrix values may be performed by software during, for example, a calibration stage at power-on or calculated dynamically for every sample, or by hardware. As will be appreciated, the choice is within the discretion of the system designer and may reflect computational resources available, desired performance and other similar factors. In one example, receiver 700 may operate at an IF, $f_{IF}$ of 727.27 MHz (32 MHz/44.) The number of values m necessary to populate the LUT with entries for the functions may be given by the ratio of the internal digital rate to the IF, $f_{in}/f_{IF}$. As such, in receiver 700 operating with $f_{in}$ of 8 MHz, m may equal 8/0.72727 or 11. Therefore, the resources associated with providing the cosine and sine functions may be relatively modest.

Described herein are presently preferred embodiments. However, one skilled in the art that pertains to the present invention will understand that the principles of this disclosure can be extended easily with appropriate modification.

What is claimed is:

1. A digital wireless receiver for receiving a data signal, wherein the receiver has a signal path comprising a quadrature downconverter configured to receive a radio frequency (RF) signal corresponding to the data signal and output an in-phase component and a quadrature component at an intermediate frequency (IF), an IF rotation block configured to downconvert the in-phase component and quadrature component to baseband and an in-phase (I)-quadrature (Q) correction block configured to compensate for a modeled I-Q imbalance in the received signal, wherein the I-Q correction block is positioned downstream from the IF rotation block in the signal path;

wherein upconversion of the data signal to IF is modeled by a matrix A and wherein the IF rotation block is configured to perform an operation corresponding to multiplication by an inverse of matrix A, matrix $A^{-1}$;

wherein the I-Q imbalance is modeled as a matrix B and wherein the I-Q correction block is configured to perform a matrix multiplication by $A^{-1}B^{-1}A$.

2. The receiver of claim 1, wherein the receiver further comprises a digital variable gain element positioned upstream from the I-Q correction block in the signal path.

3. The receiver of claim 1, wherein the receiver further comprises analog to digital converters operating at a sample rate to digitize the in-phase component and the quadrature component produced by the quadrature downconverter and a decimator configured to provide an internal rate lower than the sample rate, wherein the I-Q correction block is positioned downstream from the decimator in the signal path.

4. The receiver of claim 3 wherein the receiver further comprises a digital variable gain element positioned upstream from the I-Q correction block in the signal path.

5. The receiver of claim 3, wherein the I-Q correction block operates at the internal rate.

6. The receiver of claim 1, wherein $$A^{-1}B^{-1}A = \begin{bmatrix} c_{11} & c_{12} \\ c_{21} & c_{22} \end{bmatrix},$$

where $c_{11} =$
$\cos^2(2\pi f_{IF}nT_{in}) - \tan(\theta)\sin(2\pi f_{IF}nT_{in})\cos(2\pi f_{IF}nT_{in}) + \dfrac{\sin^2(2\pi f_{IF}nT_{in})}{\alpha\cos(\theta)}$ $c_{12} = -\sin(2\pi f_{IF}nT_{in})\cos(2\pi f_{IF}nT_{in}) +$
$\tan(\theta)\sin^2(2\pi f_{IF}nT_{in}) + \dfrac{\sin(2\pi f_{IF}nT_{in})\cos(2\pi f_{IF}nT_{in})}{\alpha\cos(\theta)}$ $c_{21} = -\sin(2\pi f_{IF}nT_{in})\cos(2\pi f_{IF}nT_{in}) - \tan(\theta)\cos^2(2\pi f_{IF}nT_{in}) +$
$\dfrac{\sin(2\pi f_{IF}nT_{in})\cos(2\pi f_{IF}nT_{in})}{\alpha\cos(\theta)}$ $c_{22} = \sin^2(2\pi f_{IF}nT_{in}) + \tan(\theta)\sin(2\pi f_{IF}nT_{in})\cos(2\pi f_{IF}nT_{in}) +$
$\dfrac{\cos^2(2\pi f_{IF}nT_{in})}{\alpha\cos(\theta)}$ $T_{in}$ is an internal digital rate of the receiver and $f_{IF}$ is the IF.

7. The receiver of claim 6, further comprising a look up table holding values for $c_{11}$, $c_{12}$, $c_{21}$ and $c_{22}$.

8. The receiver of claim 7, wherein the values for the look up table are determined during calibration.

9. A method for providing in-phase (I)-quadrature (Q) imbalance compensation for a received data signal, comprising:
  mixing a received radio frequency (RF) signal corresponding to the data signal with a cosine output of a local oscillator to extract an in-phase component at intermediate frequency (IF) and a sine output of the local oscillator to extract a quadrature component at IF;
  applying an IF rotation to the in-phase component and the quadrature component to downconvert the in-phase component and the quadrature component to baseband; and
  applying a modeled I-Q imbalance compensation to the in-phase component and the quadrature component at baseband;
  wherein upconversion of the data signal to IF is modeled by a matrix A and wherein applying the IF rotation to the in-phase component and the quadrature component corresponds to multiplication by an inverse of matrix A, matrix $A^{-1}$;
  wherein the I-Q imbalance is modeled as a matrix B and wherein applying the I-Q imbalance compensation to the in-phase component and the quadrature component at baseband corresponds to matrix multiplication by $A^{-1}B^{-1}A$.

10. The method of claim 9, further comprising digitally adjusting the gain of the in-phase component and the quadrature component prior to applying the I-Q imbalance compensation.

11. The method of claim 9, further comprising downsampling the sample rate of the in-phase component and the quadrature component at IF to an internal rate lower than the sample rate prior to applying the I-Q imbalance compensation.

12. The method of claim 11 further comprising digitally adjusting the gain of the in-phase component and the quadrature component prior to applying the I-Q imbalance compensation.

13. The method of claim 11, wherein the I-Q imbalance compensation is applied at the internal rate.

14. The method of claim 9, wherein $$A^{-1}B^{-1}A = \begin{bmatrix} c_{11} & c_{12} \\ c_{21} & c_{22} \end{bmatrix},$$

where $$c_{11} = \cos^2(2\pi f_{IF} n T_{in}) - \tan(\theta)\sin(2\pi f_{IF} n T_{in})\cos(2\pi f_{IF} n T_{in}) + \frac{\sin^2(2\pi f_{IF} n T_{in})}{\alpha\cos(\theta)}$$

$$c_{12} = -\sin(2\pi f_{IF} n T_{in})\cos(2\pi f_{IF} n T_{in}) + \tan(\theta)\sin^2(2\pi f_{IF} n T_{in}) + \frac{\sin(2\pi f_{IF} n T_{in})\cos(2\pi f_{IF} n T_{in})}{\alpha\cos(\theta)}$$

$$c_{21} = -\sin(2\pi f_{IF} n T_{in})\cos(2\pi f_{IF} n T_{in}) - \tan(\theta)\cos^2(2\pi f_{IF} n T_{in}) + \frac{\sin(2\pi f_{IF} n T_{in})\cos(2\pi f_{IF} n T_{in})}{\alpha\cos(\theta)}$$

$$c_{22} = \sin^2(2\pi f_{IF} n T_{in}) + \tan(\theta)\sin(2\pi f_{IF} n T_{in})\cos(2\pi f_{IF} n T_{in}) + \frac{\cos^2(2\pi f_{IF} n T_{in})}{\alpha\cos(\theta)}$$

$T_{in}$ is an internal digital rate of the receiver and $f_{IF}$ is the IF.

15. The method of claim 14, further comprising storing values for $c_{11}$, $c_{12}$, $c_{21}$ and $c_{22}$ in a look up table.

16. The method of claim 15, further comprising determining the values for the look up table during calibration.

17. The receiver of claim 1, wherein the I-Q correction block is configured to perform a correction having a term corresponding to IF rotation derived from upconversion of the data signal to IF.

18. The method of claim 9, wherein the modeled I-Q imbalance compensation has a term corresponding to the IF rotation derived from upconversion of the data signal to IF.

* * * * *